United States Patent
Kaller et al.

(10) Patent No.: US 11,194,119 B2
(45) Date of Patent: Dec. 7, 2021

(54) OPTICAL ASSEMBLY HAVING A THERMALLY CONDUCTIVE COMPONENT

(71) Applicant: Carl Zeiss SMT GmbH, Oberkochen (DE)

(72) Inventors: Julian Kaller, Koenigsbronn (DE); Franz Sorg, Aalen (DE); Ralf Winter, Schwaebisch Gmuend (DE); Karl-Stefan Weissenrieder, Elchingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 166 days.

(21) Appl. No.: 16/701,480

(22) Filed: Dec. 3, 2019

(65) Prior Publication Data
US 2020/0103771 A1    Apr. 2, 2020

Related U.S. Application Data

(60) Division of application No. 15/604,837, filed on May 25, 2017, now Pat. No. 10,509,336, which is a
(Continued)

(51) Int. Cl.
*G02B 7/02*    (2021.01)
*G03F 7/20*    (2006.01)
*G02B 7/18*    (2021.01)

(52) U.S. Cl.
CPC .............. *G02B 7/028* (2013.01); *G02B 7/181* (2013.01); *G02B 7/1815* (2013.01);
(Continued)

(58) Field of Classification Search
CPC .......... G02B 7/00; G02B 7/028; G02B 7/181; G02B 7/1815; G03F 7/70958; G03F 7/70341; G03F 7/70891
(Continued)

(56) References Cited

U.S. PATENT DOCUMENTS 8,279,402 B2    10/2012  Six et al.
8,976,335 B2*   3/2015   Beerens ............... G03F 7/70716
                                                        355/72
(Continued)

FOREIGN PATENT DOCUMENTS

DE   10 2004 060 184 A1   7/2006
DE   10 2006 021 797 A1   11/2007
(Continued)

OTHER PUBLICATIONS

"Top 10 Thermally Conductive Materials" Thermatest Inc, https://thermatest.com/thermal-resources/top-10-thermally-conductive-materials (Year: 2021).*
(Continued)

*Primary Examiner* — Kristina M Deherrera
(74) *Attorney, Agent, or Firm* — Fish & Richardson P.C.

(57) ABSTRACT

An optical assembly includes: an optical element, which is transmissive or reflective to radiation at a used wavelength and has an optically used region; and a thermally conductive component, which is arranged outside the optically used region of the optical element. The thermally conductive component can include a material having a thermal conductivity of more than 500 W m$^{-1}$ K$^{-1}$. Additionally or alternatively, the product of the thickness of the thermally conductive component in millimeters and the thermal conductivity of the material of the thermally conductive component is at least 1 W mm m$^{-1}$ K$^{-1}$.

20 Claims, 5 Drawing Sheets

Related U.S. Application Data continuation of application No. PCT/EP2014/076366, filed on Dec. 3, 2014.

(52) U.S. Cl.
CPC ...... *G03F 7/70341* (2013.01); *G03F 7/70891* (2013.01); *G03F 7/70958* (2013.01)

(58) Field of Classification Search
USPC .......................................................... 359/845
See application file for complete search history.

(56) References Cited

U.S. PATENT DOCUMENTS

| | | | |
|---|---|---|---|
| 10,509,336 | B2 | 12/2019 | Kaller et al. |
| 2005/0018154 | A1 | 1/2005 | Box et al. |
| 2005/0219501 | A1 | 10/2005 | Sato et al. |
| 2006/0213428 | A1 | 9/2006 | Meguro et al. |
| 2006/0291060 | A1 | 12/2006 | Shirai et al. |
| 2007/0146679 | A1 | 6/2007 | Sutedja et al. |
| 2007/0153253 | A1 | 7/2007 | Van Buel et al. |
| 2008/0138631 | A1 | 6/2008 | Patel et al. |
| 2009/0135385 | A1 | 5/2009 | Gellrich et al. |
| 2010/0279232 | A1 | 11/2010 | Dziomkina et al. |
| 2011/0025992 | A1 | 2/2011 | Holderer et al. |
| 2011/0310368 | A1 | 12/2011 | Schmitz et al. |
| 2011/0317140 | A1 | 12/2011 | Sigel et al. |
| 2013/0298823 | A1* | 11/2013 | Francis .............. H01L 21/0254 117/86 |
| 2017/0261867 | A1 | 9/2017 | Kaller et al. |

FOREIGN PATENT DOCUMENTS

| | | |
|---|---|---|
| DE | 10 2009 009 221 A1 | 8/2010 |
| DE | 10 2009 035 788 A1 | 2/2011 |
| DE | 10 2011 088 623 A1 | 1/2013 |
| EP | 2 278 402 A2 | 1/2011 |
| JP | 2004-343116 | 12/2004 |
| JP | 2007-208240 | 8/2007 |
| JP | 2012-129319 | 7/2012 |
| JP | 2014-132694 | 7/2014 |
| JP | 2014-168095 | 9/2014 |
| WO | WO 2012/152661 A1 | 11/2012 |
| WO | WO 2013/087300 A1 | 6/2013 |

OTHER PUBLICATIONS

M. Shamsa et al., "Thermal Conductivity of Diamond-Like Carbon Films", Applied Physics Letters 89, 161921 (2006).

M.N.R. Ashfold et al., "Thin Film Diamond by Chemical Vapour Deposition Methods", Chemical Society Reviews, 1994, pp. 21 to 30.

"The CVD Diamond Booklet" Diamond Materials, Advanced Diamond Technology, Germany, 2008, retrieved from www.diamond~materials.com/download, (27 pages).

"Diamond—the Hardest Material for Harshest Requirements", DiaCCon GmbH, Germany; retrieved from www.diaccon.de (14 pages).

"Polycrystalline CVD diamond", Element Six retrieved from www.e6.com (2 pages).

M. Karlsson et al., "From Hydrophilic to Superhydrophobic: Fabrication of Micrometer-Sized Nail-Head-Shaped Pillars in Diamond" Langmuir 2010, 26(2), 889-893.

Y. Coffinier, "Preparation of Superhydrophilic and Oleophobic Diamond Nanograss Array", J. Mater. Chem., 2010, 20, 10671-10675.

K. Larsson et al., "Role of Water and Oxygen in Wet and Dry Oxidation of Diamond", Journal of Applied Physics, 90, 1026, 2001.

International Search Report for corresponding Appl PCT/EP2014/076366, dated Aug. 5, 2015, (2 pages).

International Preliminary Report on Patentability for corresponding Appl PCT/EP2014/076366, dated Jun. 15, 2017. (7 pages).

Japanese Office Action, with translation thereof, for corresponding Appl No. 2017-529616, dated Aug. 28, 2018.

Vrolijk et al. WO 2012/152661 A 1 (Nov. 15, 2012) English translation obtained by proquest.

* cited by examiner

OPTICAL ASSEMBLY HAVING A THERMALLY CONDUCTIVE COMPONENT

CROSS-REFERENCE TO RELATED APPLICATIONS

The present application is a divisional of, and claims benefit under 35 USC 120 to, U.S. application Ser. No. 15/604,837, filed May 25, 2017, which is a continuation of, and claims benefit under 35 USC 120 to, international application PCT/EP2014/076366, filed on Dec. 3, 2014. The entire disclosure of these applications are incorporated by reference herein.

FIELD

The disclosure relates to an optical assembly, in particular a projection exposure apparatus for microlithography.

BACKGROUND

Modern lithography systems react very sensitively to heat entering their optical elements, for example lenses or mirrors, because their optical surfaces are deformed as a result of the coefficients of thermal expansion having a value other than zero of the lens materials or mirror materials used. Furthermore, the refractive index of optical elements that are used in transmission, for example lenses or plane plates, is temperature-dependent.

In a lithography system, for example in a wafer scanner for the microstructuring of semiconductor components, various local heat sources and heat sinks are present. The heat sources include absorbed radiation, in particular at the used wavelength of the lithography system, which as a result of scattering or diffraction is incident on parts of the optical system or on components arranged in the lithography system having no optical effect. In addition, in such a system there are actuators and sensors, which, depending on the type, give off heat to the environment continuously or time-dependently. In particular if the actuators are used for a movement or deformation of the optical elements, they are generally positioned very close to the optical elements.

In the case of immersion systems, i.e. in the case of lithography systems in which an immersion fluid is introduced between the last optical element of a projection lens and the substrate (wafer) to be exposed, there are in addition local cooling effects if optical elements or other components that are arranged near the immersion fluid are partially wetted with the immersion fluid and the immersion fluid on the wetted surface of the optical element or component evaporates and extracts heat from it.

In order to prevent the wetting with an immersion fluid of an unpolished surface of a component mounted outside an optically free diameter, it is known from U.S. Pat. No. 8,279,402 B2 to apply a hydrophobic coating to the unpolished surface. The hydrophobic coating may have a UV-resistant layer, which is configured to absorb or reflect UV radiation with a wavelength of less than 260 nm.

In WO 2013/087300 A1 there is a description of an optical assembly which includes at least one component that is at least partially wetted with water as an immersion fluid during the operation of the optical assembly. The component has at least one layer that contains a material of which the contact angle with the immersion fluid can be optionally set to be hydrophilic or hydrophobic. The material may be graphene and/or $Co_3O_4$ nanorod arrays.

In DE 10 2011 088 623 A1 there is a description of an optical element with an optically used volume region for the transmission of UV radiation that has a portion with a reduced thermal conductivity in comparison with the optically used volume region of the main body in order to protect the optically used volume region from thermal influences when the optical element is wetted with a fluid.

In US 2010/0279232 A1 there is a description of a microlithographic projection exposure apparatus which has a surface that is in contact with an immersion fluid during operation. The surface has a surface roughness $R_a$ of less than or equal to 0.2 µm. The immersion fluid may have at the surface a contact angle of 60° or more. The surface may be formed on a last optical element of a projection system, a holder for a substrate or a table for a substrate. The surface may have a coating which is formed from $SiO_xC_y$.

US 2007/0146679 A1 describes a lithography apparatus which has a substrate carrier that is designed to keep a substrate in position via an electrostatic force and has an integral power source. For generating the electrostatic force, a potential difference is produced on the substrate carrier between a metallic layer and a layer of diamond-like carbon.

It is known from US 2008/0138631 A1 to provide a component, for example an optical component, for immersion lithography with a protective coating including a layer that has a hardness greater than the hardness of quartz, at least in a region that comes into contact with the immersion fluid. The layer may contain silicon carbide, diamond, diamond-like carbon, boron nitride, tungsten carbide, aluminum oxide, sapphire, titanium nitride, titanium carbonitride, titanium aluminum nitride or titanium carbide. The layer may be formed by CVD, PECVD, APCVD, LPCVD, LECVD, PVD, thin-film evaporation, sputtering or thermal annealing in the presence of a gas.

EP 2 278 402 A2 has disclosed an optical element for immersion lithography that has a light-shielding layer which is formed on a side surface of the transmissive optical element on the side of a projection system that is facing the substrate. The transmissive optical element with the light-shielding layer is in contact with the immersion fluid during the exposure. The light-shielding layer may be formed for example from a metal or a metal oxide.

SUMMARY

The disclosure seeks to provide an optical assembly that prevents or at least greatly reduces a change in temperature, in particular a local change in temperature, at an optical element or at a device for positioning a light-sensitive substrate that is caused by a heat source or a heat sink.

In one aspect, the disclosure provides optical assembly, in particular a projection exposure apparatus for microlithography, including: an optical element that is transmissive or reflective to radiation at a used wavelength and has an optically used region, and also a thermally conductive component, which is arranged outside the optically used region of the optical element, the thermally conductive component including a material with a thermal conductivity of more than 500 W m$^{-1}$ K$^{-1}$ and/or the following applying for the product of the thickness D of the thermally conductive component in millimeters and the thermal conductivity $\lambda$ of the material of the thermally conductive component: D$\lambda$>1 W mm m$^{-1}$ K$^{-1}$, preferably D$\lambda$>10 W mm m$^{-1}$ K$^{-1}$, in particular D$\lambda$>50 W mm m$^{-1}$ K$^{-1}$.

It is proposed to avoid a change in temperature in the material of the optical element by introducing a (typically self-supporting) component with a very high thermal conductivity, or with a sufficiently great product of thermal conductivity and thickness, between the optical element and a heat source or heat sink. For this purpose, the thermally conductive component is arranged outside the optically used region of the optical element. The optically used region is that region through which the radiation passes in a directed manner at the used wavelength, i.e. that region which, for example in the case of a lens, contributes to the imaging. The optically used region may in this case be defined here in particular by the region of the surface of the optical element in which the surface is polished, whereas the region outside this diameter has a surface which is unpolished, matt and consequently rough. The optically used region may also be a volume region of a transmissive optical element that is passed through by the radiation at the used wavelength. In the case of a reflective optical element, the optically used region is typically delimited by a reflective coating applied to the optical element.

The thermally conductive component should have a thermal conductivity that is as high as possible in order to take up as little installation space as possible, or the thermal conductivity should be at least great enough that the product of the thermal conductivity and the thickness of the thermally conductive component exceeds the value specified above. The arrangement of the thermally conductive component outside the optically used region of the optical element or outside the beam path of the used radiation that passes through the optical element or is reflected at it allows the use of thermally conductive materials that are opaque to the radiation at the used wavelength. The use of a self-supporting thermally conductive component has the advantage over a coating that it can be exchanged if desired.

The thermal conductivity of the thermally conductive component relates to the operating temperature of the optical assembly, which generally coincides with room temperature (22° C.). At operating temperatures deviating greatly from room temperature, the thermal conductivity of a material may possibly deviate significantly from the thermal conductivity at room temperature. For optical assemblies that are operated for example under liquid nitrogen, more materials may therefore meet the condition of a thermal conductivity of more than 500 W $m^{-1}$ $K^{-1}$, or the condition $D\lambda > 1$ W mm $m^{-1}$ $K^{-1}$ or $D\lambda > 10$ W mm $m^{-1}$ $K^{-1}$ and $D\lambda > 50$ W mm $m^{-1}$ $K^{-1}$, than is the case at room temperature. Most of the materials used for optical purposes have a comparatively low thermal conductivity at room temperature (quartz glass ($SiO_2$) for example 1.3 W $m^{-1}$ $K^{-1}$).

The material of the thermally conductive component has in the present case a higher thermal conductivity than the material of the optical element, so that the heat conduction of the material of the thermally conductive material in the lateral direction is greater than the heat conduction perpendicularly to the surface of the optical element. Therefore, the cold of condensation that is produced during the evaporation of a liquid droplet is distributed over the surface of the optical element. The imaging properties of the optical element are therefore no longer greatly impaired at an isolated point in the region of the evaporating droplet, but instead the impairment of the imaging properties is distributed over a greater region. An imaging error that is spatially distributed in such a way disturbs the imaging to a considerably lesser extent, and can be corrected much more easily, for example by already existing manipulators, than a strong, locally limited imaging error.

In one embodiment, the material has a thermal conductivity of more than 1000 W $m^{-1}$ $K^{-1}$, preferably of more than 1700 W $m^{-1}$ $K^{-1}$, particularly preferably of more than 2000 W $m^{-1}$ $K^{-1}$. The number of materials that have such a high thermal conductivity at room temperature is small, but a thermal conductivity that is as great as possible is advantageous to ensure effective heat conduction. Metallic materials typically have a thermal conductivity that is less than 500 W $m^{-1}$ $K^{-1}$.

In a particularly advantageous embodiment, the material contains polycrystalline and/or monocrystalline diamond or consists of polycrystalline and/or monocrystalline diamond. Synthetically produced diamond has been found to be particularly advantageous as a material for the thermally conductive component because it can be produced with a high thermal conductivity of 1000-2000 W $m^{-1}$ $K^{-1}$ or above. Moreover, diamond has a very high modulus of elasticity of about 1050 GPa, for which reason diamond structures even of a very small thickness or wall thickness are self-supporting, and so a self-supporting component can be produced from diamond with little material expenditure. On the other hand, so-called diamond-like carbon is unsuitable as a material for the thermally conductive component, because its thermal conductivity is much too low for the present applications; it is for example less than about 4 W $m^{-1}$ $K^{-1}$, cf. "Thermal Conductivity of Diamond-Like Carbon Films" by M. Shamsa et al., Applied Physics Letters 89, 161921 (2006). Diamond typically grows either in a polycrystalline or monocrystalline state on a carrier body, but it is in some cases also possible to produce a diamond body that is monocrystalline in one partial region and polycrystalline in another partial region, as it described for example in US 2006/0213428 A1, in which a crystal seed of monocrystalline diamond is bonded to a polycrystalline diamond layer to produce a diamond substrate.

In a further embodiment, the material contains carbon nanotubes. Carbon nanotubes are also suitable as a material for the thermally conductive component because they achieve the desired high thermal conductivity of more than 500 W $m^{-1}$ $K^{-1}$, possibly of 1000 W $m^{-1}$ $K^{-1}$ or above. Both diamond and carbon nanotubes achieve the desired thermal conductivity at room temperature. Other materials, for example sapphire, can likewise achieve the desired thermal conductivity under corresponding temperature conditions, for example if the optical assembly is cooled with liquid nitrogen (at about −196° C.) and the thermally conductive component has a corresponding temperature.

The material is preferably produced by a CVD process. A CVD process is particularly advantageous for producing structures from diamond, as described for example in the article "Thin Film Diamond by Chemical Vapour Deposition Methods" by M. N. R. Ashfold et al., Chemical Society Reviews, 1994, pages 21 to 30. In order to produce a self-supporting component from diamond that has been deposited via a CVD process, the carrier body or the substrate to which the coating of diamond is applied may be dissolved, for example with the aid of a hot hydrogen peroxide solution or with the aid of hydrofluoric acid, so that only the diamond component remains. The geometry of the diamond component can be varied within wide limits by the geometry of the carrier body, so that thin-walled, self-supporting components with a complex three-dimensional geometry can be produced.

Diamond deposited by CVD processes achieves thermal conductivities of 1800 W $m^{-1}$ $K^{-1}$ or above. These and further properties of CVD diamond can be taken from the brochure "The CVD Diamond Booklet", which can be retrieved from "www.diamond-materials.com/download", cf. also the brochure "Diamond—the Hardest Material for Harshest Requirements", which can be retrieved from "www.diaccon.de", or the website of the company Element Six "www.e6.com" on the applications of polycrystalline CVD diamond and monocrystalline synthetic diamond. For the purposes of this application, a CVD process is understood as including all variants of chemical deposition from the vapor phase, for example plasma-assisted CVD, etc.

In a further embodiment, the thermally conductive component has a thickness of less than 500 µm. A self-supporting component with such a small thickness can be achieved by using diamond as the thermally conductive material, because this material has a sufficiently great modulus of elasticity. A thickness of more than 25 µm, preferably of more than 100 µm, of the thermally conductive component has been found to be particularly advantageous.

In a further embodiment, the material of the thermally conductive component contains a metal. Metallic materials typically have a high thermal conductivity of more than 100 $W\ m^{-1}\ K^{-1}$, and are therefore suitable as thermally conductive components if they have a sufficient thickness to perform the function of heat conduction efficiently. The metal may be for example Cu, Al, Ag, etc. The thermally conductive component is produced with a thickness that meets the condition specified above, i.e. $D\lambda > 1\ W\ mm\ m^{-1}\ K^{-1}$, preferably $D\lambda > 10\ W\ mm\ m^{-1}\ K^{-1}$, in particular $D\lambda > 50\ W\ mm\ m^{-1}\ K^{-1}$. This condition may be met for example in the case of silver, which has a thermal conductivity of $\lambda = 429\ W\ m^{-1}\ K^{-1}$, if the thermally conductive component has a thickness D of more than 2.3 µm, of more than 23 µm or of more than 115 µm. The thermally conductive component is typically self-supporting, which—depending on the material used—is the case with a thickness D of typically more than about 50 µm, possibly of more than about 100 µm, and can be placed or slipped onto the optical element over the edge thereof.

In a development of this embodiment, the thermally conductive component is produced by electroforming. In the case of electroforming, the metallic material of the thermally conductive component is deposited in an electrochemical way on a model or a master, it being possible to achieve layer thicknesses of more than 1 mm. After coating, the thermally conductive, self-supporting component can be detached from the master. Once produced with high precision, a master can be reused, so that the electroforming can also be performed with high precision.

The thermally conductive, metallic component can also be reliably produced by some other electrochemical process or by machining. The production of a self-supporting thermally conductive component has the advantage over applying a coating with a corresponding thickness to the optical element that the layer stresses that possibly occur in the applied coating during the coating cannot lead to stresses, and consequently to changes in the refractive index, in the material of the optical element.

In a further embodiment, the material of the thermally conductive component forms a preferably preformed woven fabric. The woven fabric may be pulled, or slipped in the manner of a sock, onto the edge of the optical element outside the optically used region and fixed there. The production of a woven fabric is known from other application areas, for example the sheathing of cables, and can therefore be performed at low cost.

In a development, the woven fabric contains a metallic material or a metal and/or a carbon compound. Woven fabrics of a metallic material, for example in the form of chromium nickel steel, are known from the sheathing of cables and can be used in a corresponding way for the production of the thermally conductive component. A thermally conductive woven fabric may also be produced from certain thermally conductive carbon compounds, for example the carbon nanotubes described above, or from other metals, for example from Ag, Al, Cu. It is advantageous if the thermally conductive component has a slightly smaller dimension than the region of the optical element onto which it is slipped. In this way, the woven fabric exerts a mechanical stress on the optical element, so that it cannot slide upward, even if a bonding location loosens.

In one embodiment, the (separately produced) thermally conductive component is connected to the optical element directly or indirectly, i.e. by way of another component or material. The form or the geometry of the thermally conductive component is in this case adapted to the form or the geometry of the optical element in the region of the connection. The connection may be produced in a cohesive manner, for example by adhesive bonding, by low-temperature bonding ("fusion bonding") or in some other way, for example by optical contact bonding, or by soldering. Low-temperature bonding is understood as meaning a bonding process that is carried out at temperatures of typically less than about 400° C.

The inventors have realized that the mounting of a self-supporting thermally conductive component on the optical element is advantageous because the growing of a layer of the thermally conductive material, for example diamond, onto a surface of the optical element, involves heating the latter to a high temperature of more than 400° C., possibly to 600° C., to 800° C. or more, which leads to stresses in the material of the optical element even within the optically used region or volume, and typically results in imaging errors.

In one embodiment, the thermally conductive component is connected to the optical element over a surface area or areas or at an isolated point or points. A surface-area connection can be established by (low-temperature) bonding, by adhesive bonding, by soldering or by optical contact bonding. In particular when an adhesive is used for connecting the thermally conductive component and the optical element, an adhesive connection may be established at an isolated point or points, i.e. it is not necessary that the adhesive is applied over a surface area or areas to the elements to be connected. Optical contact bonding is a way of connecting two materials in which the surface areas which are put together are only held by molecular forces of attraction, so that the connection can be partially or completely broken (for example under the influence of moisture or a wedge effect). In the case of bonding ("fusion bonding"), two or more surfaces are connected to one another by the effect of heat, but the temperature should not be chosen to be too great during the bonding and should lie at about 400° C. or below. A connection of the optical element to the thermally conductive component may also be established in some other way, for example by anodic bonding or—when using a thermally conductive component of a metallic material—by soldering.

In a further embodiment, the connection has a heat transfer coefficient of less than 1000 $W\ m^{-2}\ K^{-1}$, preferably of less than 100 $W\ m^{-2}\ K^{-1}$. Such a connection can be established in particular with the aid of an adhesive that has a low thermal conductivity. A connection with such a low heat transfer coefficient is advantageous if the optical element is to be protected with the aid of the thermally conductive component from heat or cold of a heat source or heat sink located in the environment. If, on the other hand, the intention is to promote removal of heat from the optical element, a high thermal conductivity or a high heat transfer coefficient of the adhesive used, as there is for example in the case of a silver conductive adhesive or in the case of a soldered connection, is advantageous.

In a further embodiment, the thermally conductive component is connected to the optical element by way of a material that has a thermal conductivity of less than 1 W m$^{-1}$ K$^{-1}$, preferably of less than 0.1 W m$^{-1}$ K$^{-1}$. In this embodiment, a material with a low thermal conductivity is introduced between the thermally conductive material and the optical element in order to establish a good thermal insulation between the optical element and the thermally conductive element. This is advantageous if the thermally conductive component is intended to be used for protecting the optical element from heat or cold. The material may be for example a foam or some other material of low conductivity. It goes without saying that the material should have a lower thermal conductivity than the material of the optical element itself. In the case of typical optical materials, such as for example quartz glass, the thermal conductivity is typically no more than 2 W m$^{-1}$ K$^{-1}$.

In a further embodiment, the thermally conductive component is connected to the optical element by way of a friction-locked connection, in particular by way of a clamping connection or by way of a screwing connection, and not by way of a cohesive connection. The thermally conductive component may be connected by way of a clamping connection directly to the optical element, to the mounting of the optical element or possibly to a component in which the optical element is arranged, for example the mounting of a projection lens. The screwing connection of the thermally conductive component is typically not established directly with the optical element, but with the mounting/mount of the optical element or with some other component, for example a mounting of the projection lens.

In an alternative embodiment, the thermally conductive component is arranged at a distance from the optical element. Arranging at a distance is advantageous if the thermally conductive component is intended to be used for protecting the optical element from heat or cold, because in this case a good heat transfer between the optical element and the thermally conductive component is not desired.

In a development, the distance between the thermally conductive component and the optical element is between 100 µm and 1000 µm. A gas or possibly a (flowing) liquid may be introduced into the gap formed between the optical element and the thermally conductive component in order to ensure a thermal insulation that is as good as possible between the optical element and the thermally conductive component. In order to arrange the thermally conductive component in the direct proximity of the optical element, it may be mounted in particular on a mount or mounting for the optical element.

In principle, the optical element of the optical assembly may be designed as desired. The optical element is preferably selected from the group including: a lens, a mirror, a plane-parallel plate and a microstructured element, for example in the form of a micromirror array or a facet mirror. Apart from optical elements that are operated in transmission, for example lenses or plane-parallel plates, reflective optical elements, for example in the form of mirrors, may also be provided with a thermally conductive component. In the latter case, such a component may be arranged outside an optically used region in which the mirror is provided with a reflective coating. The optical element may be designed in particular to reflect radiation in the EUV wavelength range of between about 5 nm and about 35 nm and for this purpose is typically provided with a reflective coating. The optical element may however also be designed to transmit or reflect radiation in the UV wavelength range.

In a further embodiment, the optical element is formed from a material that is selected from the group including: quartz glass, crystalline quartz, a crystal from the group of fluorides, polishable metals such as copper or aluminum, titanium-doped quartz glass, a glass ceramic or a ceramic. The first three materials are typically used for the production of optical elements that are designed for the transmission of radiation, for example in the UV wavelength range. Titanium-doped quartz glass and also glass ceramics or ceramics may be formed in such a way that they have a very low coefficient of thermal expansion. Such a commercially available silicate glass is sold by Corning Inc. under the trade name ULE® (Ultra Low Expansion Glass). Glass ceramics with a very low coefficient of thermal expansion are offered for example under the trade name Zerodur® by Schott AG or under the trade name Clearceram® by Ohara Inc. The aforementioned materials may be used as substrates for mirrors that are used for the reflection of EUV radiation, for example in a projection exposure apparatus for EUV lithography. Metal mirrors, in particular of aluminum and copper alloys, are used in EUV illumination systems, in particular in the case of the first mirrors downstream of the light source, because they have to remove a high level of thermal power, caused by absorption of the mirror layers.

In one embodiment, the thermally conductive component is connected on at least one side directly or indirectly, i.e. by way of another component, to a heat source. The heat source may be for example a component through which a current flows, in particular an actuator or a sensor. The thermally conductive component is used in this case for the removal of heat that is produced at the actuator or at the sensor and may be connected on an opposite side to a heat sink in order to remove the heat produced by the component through which a current flows.

In a further embodiment, the thermally conductive component is connected on at least one side directly or indirectly, i.e. by way of another component, to a heat sink. The heat sink may be for example a cooler through which a gas or gas mixture or a liquid flows. In this embodiment, the thermally conductive component is typically used for preventing heat from entering the optical element and for feeding the heat taken up to the cooler, by way of which this heat can be transported away from the environment of the optical element. The cooler may in particular be integrated in a mount or a mounting for the optical element or be in thermally conductive connection with it.

In a further embodiment, the thermally conductive component is exposed, at least in a partial region, to radiation during the operation of the optical assembly and is designed for the absorption of the radiation, i.e. the thermally conductive component is opaque to the incident radiation. The thermally conductive component may for example be exposed to stray light from the beam path of the radiation at the used wavelength. As an alternative or in addition, the thermally conductive component may be exposed to thermal radiation that is emitted by a heat source, for example by a component through which a current flows. In the latter case, this is typically radiation in the IR wavelength range, in the former case radiation in the UV wavelength range or in the EUV wavelength range. In both cases, the thermally conductive component is designed for the absorption of the radiation, i.e. it is opaque to the incident radiation. If the thermally conductive material itself is transparent to the incident radiation, it can if desired be made opaque to the incident radiation by applying a (thin) opaque layer or coating. The latter is desirable for example if the material of the thermally conductive component is diamond and the incident radiation is thermal radiation.

In a further embodiment, the thermally conductive component is exposed, at least in a partial region, to an evaporating liquid during the operation of the optical assembly. The liquid extracts heat from the thermally conductive component during the evaporation. The liquid may be in particular an immersion fluid introduced between the optical element and a substrate to be exposed. The immersion fluid is used to increase the numerical aperture of a projection lens of the optical assembly, which in this case is designed as a projection exposure apparatus for immersion lithography.

In such a projection exposure apparatus, a last optical element of the projection lens is typically immersed with an optical surface in the immersion fluid, but also has a surface region that is in connection with a gas (nitrogen, purified air, helium, . . . ) and is not immersed in the immersion fluid. A rapid movement of the substrate or wafer to be exposed causes fluctuations of the level of the immersion fluid on the underside of the last optical element. This may have the consequence that droplets of the immersion fluid remain on the surface that is not immersed in the immersion fluid. When these droplets evaporate, cooling of the material of the optical element, for example quartz glass, occurs locally, which leads to a local change in the refractive index and also to the optical element being deformed locally as a result of the thermal expansion. Both effects may lead to image errors, in particular with a lens as the last optical element, are therefore undesired and can be prevented with the aid of the thermally conductive component. In particular when (ultrapure) water is used as the immersion fluid, a thermally conductive component made of diamond is particularly advantageous, because the diamond does not dissolve in water and also does not give off any traces of metal ions into the immersion fluid, so that diamond can be used better in an environment with water as an immersion fluid than metals with a high thermal conductivity such as silver, copper etc.

The wetting properties of a component made of diamond can be set from hydrophilic to superhydrophobic by a surface treatment or a microstructuring, as described for example in the article "From Hydrophilic to Superhydrophobic: Fabrication of Micrometer-Sized Nail-Head-Shaped Pillars in Diamond" by M. Karlsson et al., Langmuir 2010, 26(2), 889-893. The contact angle with water can be increased in comparison with (unstructured) diamond by a fluorine termination of the surface of the thermally conductive component that is facing the immersion fluid. Such a fluorine-terminated surface can be produced by treatment with plasma that contains fluorocarbons and/or SF6. The combination of the fluorine termination with a periodic microstructure of the diamond surface allows a superhydrophobicity of the surface to be produced. It is likewise known from the above article that a microcrystalline diamond surface is to be preferred over a nanocrystalline diamond surface if a lowest-possible hysteresis of the contact angle is desired, which is typically the case with systems for immersion lithography. If, as described above, the diamond is produced in a CVD process, its crystallinity can be set by the coating parameters. These should be chosen such that a deposition that is as microcrystalline as possible takes place.

The production of diamond with strongly hydrophobic properties is also described in the article "Preparation of Superhydrophilic and Oleophobic Diamond Nanograss Array" by Y. Coffininer et al., J. Mater. Chem., 2010, 20, 10671-10675. In the article, a plasma etching is carried out on boron-doped diamond that is subsequently chemically treated with fluorinated silanes. Hydrophilic properties of a diamond surface can be achieved by a surface treatment in an oxygen plasma or by irradiation with UV radiation in water or by wet oxidation in an $O_2$, $H_2O$ mixture, cf. the article "Role of Water and Oxygen in Wet and Dry Oxidation of Diamond" by K. Larsson et al., Journal of Applied Physics, 90, 1026, 2001.

A further aspect of the disclosure relates to an optical assembly, in particular a projection exposure apparatus for microlithography, including a device for positioning a light-sensitive substrate and also a thermally conductive component that includes a material with a thermal conductivity of more than 500 W $m^{-1}$ $K^{-1}$, the following applying for the product of the thickness D of the thermally conductive component in millimeters and the thermal conductivity λ of the material of the thermally conductive component: Dλ>1 W mm $m^{-1}$ $K^{-1}$, preferably Dλ>10 W mm $m^{-1}$ $K^{-1}$, in particular Dλ>50 W mm $m^{-1}$ $K^{-1}$, the thermally conductive component being mounted on the device, in particular on an upper side of the device. The device may be in particular a wafer table, on the upper side of which a wafer or a light-sensitive substrate is arranged. If the device is used in a projection exposure apparatus for immersion lithography, the upper side of the device in particular may unwantedly come into contact with the immersion fluid. The local change in temperature produced by the evaporation of the immersion fluid may lead to a deformation of the surface on which the light-sensitive substrate is held, so that its position in relation to a projection lens changes in an undesired way. In the case of the optical assembly described here, the cold of evaporation produced can be absorbed by the thermally conductive component, so that there is no local change in temperature in the material of the device for positioning the substrate. If the device is a wafer table, it may be entirely or partially formed from a material such as for example cordierite or Zerodur®, which has a thermal conductivity much lower than 500 W $m^{-1}$ $K^{-1}$.

The thermally conductive component may extend entirely or partially over the upper side of the device for positioning the wafer, and in particular be adapted to the typically plane geometry of the upper side. The self-supporting thermally conductive component may be produced in the way described further above and have the properties described further above. In particular, the thermally conductive component may be formed from monocrystalline and/or polycrystalline diamond or carbon nanotubes. The connection of the thermally conductive component to the device may also take place in the way described further above in conjunction with the optical element, i.e. the thermally conductive component may be connected to the device for example by way of an adhesive connection, by bonding, by optical contact bonding or in some other way.

Further features and advantages of the disclosure emerge from the following description of exemplary embodiments of the disclosure, with reference to the figures in the drawing, which show features to the disclosure, and from the claims. The individual features may be realized in each case individually by themselves or as a plurality in any desired combination in a variant of the disclosure.

DRAWING

Exemplary embodiments are depicted in the schematic drawing and are explained in the following description. In the figures.

In the following description of the drawings, identical reference signs are used for identical or functionally identical components.

Figure 1:
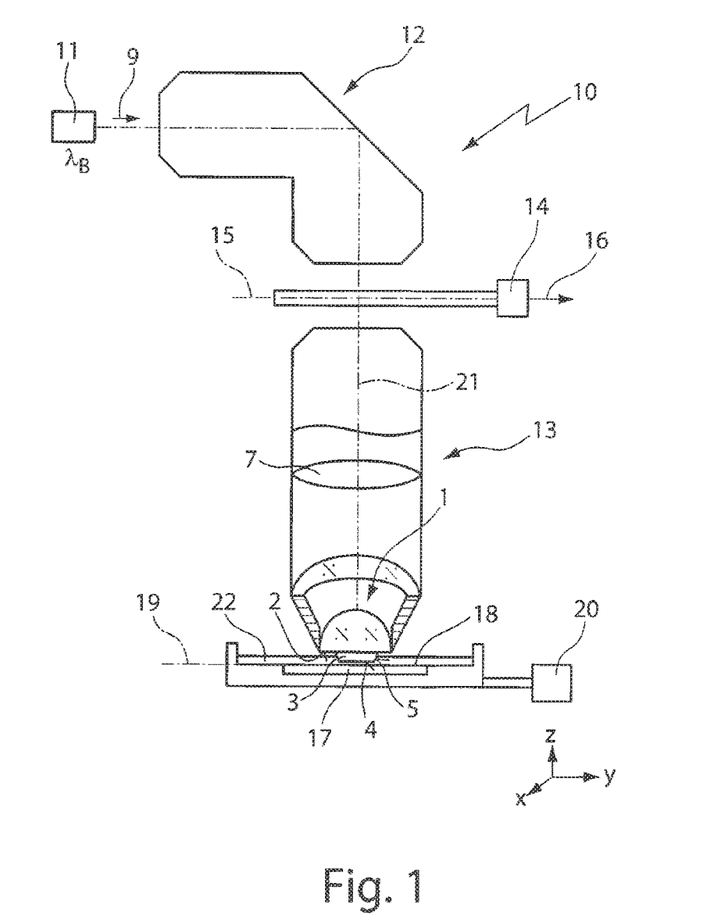
FIG. 1 shows a schematic representation of a projection exposure apparatus for immersion lithography with a lens element partially immersed in an immersion fluid.

In FIG. 1, an optical assembly 10 in the form of a projection exposure apparatus for microlithography, to be more precise in the form of a wafer scanner, for the production of large-scale-integrated semiconductor components is schematically shown. The optical assembly 10 includes as a light source an excimer laser 11 for generating radiation 9 with a used wavelength of 193 nm, other used wavelengths, for example 248 nm, also being possible. A downstream illumination system 12 generates in its exit plane a large, sharply delimited, very homogeneously illuminated image field adapted to the desired telecentricity properties of a downstream projection lens 13.

A device 14 for holding and manipulating a photomask (not shown) is arranged after the illumination system 12 such that the mask lies in the object plane 15 of the projection lens 13 and is movable in this plane for scanning operation in a traveling direction indicated by an arrow 16.

Following after the plane 15, which is also referred to as the mask plane, is the projection lens 13, which projects an image of the photomask at a reduced scale, for example at a scale of 4:1 or 5:1 or 10:1, onto a wafer 17 coated with a photoresist layer. The wafer 17 used as a light-sensitive substrate is arranged such that the plane substrate surface 18 with the photoresist layer substantially coincides with the image plane 19 of the projection lens 13. The wafer 17 is held by a device 20, which includes a scanner drive, in order to move the wafer 17 synchronously in relation to the photomask and parallel to it. The device 20 also includes manipulators for moving the wafer both in the z direction parallel to an optical axis 21 of the projection lens 13 and in the x and y directions perpendicular to this axis.

The projection lens 13 has as a final element adjacent to the image plane 19 an optical element 1 in the form of a plano-convex lens with a conical lens part 3, the end face 4 of which forms the last optical face of the projection lens 13 and is arranged at a working distance above the substrate surface 18. Arranged between the end face 4 and the substrate surface 18 is an immersion fluid 22, in the present case water, to be more precise ultrapure water, which increases the output-side numerical aperture of the projection lens 13. Via the immersion fluid 22, the imaging of structures on the photomask can take place with a higher resolution and depth of field than is possible if the intermediate space between the optical element 1 and the wafer 17 is filled with a medium with a lower refractive index, for example air. The gap that forms the intermediate space is generally between 2 mm and 4 mm.

In the example shown, the lens element 1 consists of synthetic, amorphous quartz glass ($SiO_2$) and has a conical lens part 3, on the underside of which the end face 4 of the lens element 1 is formed. The radiation 9 produced by the light source 11 passes in a directed manner through the end face 4 of the lens element 1 that forms or delimits an optically used surface region of the lens element 1. A peripheral lateral surface 5, adjoining the end face 4, of the conical lens part 3 is partially wetted by the immersion fluid 22. The conical, radially inward lens part 3 is adjoined by a radially outward plane lens face 2. The radiation 9 of the light source 11 does not pass in a directed manner through either the lateral surface 5 of the conical lens part 3 or the plane lens face 2, i.e. they are outside the beam path of the used radiation 9.

It goes without saying that optical elements for immersion lithography do not necessarily have to have the plano-convex geometry described above; however, a conically shaped volume region 3 is typical for such optical elements. The optical element 1 may also consist of some other material that is transparent above a wavelength of 250 nm or 193 nm, for example of crystalline quartz glass ($SiO_2$), barium fluoride ($BaF_2$) or germanium dioxide ($GeO_2$).

Droplets of the immersion fluid 22 may remain on the surface regions 2, 5 of the lens element 1 that are not immersed or only partially immersed in the immersion fluid 22. When these droplets evaporate, there is locally a cooling down of the quartz glass material of the lens element 1, which leads to a local change in the refractive index and also leads to the lens element 1 being deformed locally as a result of the thermal expansion. Both effects can lead to image errors, and are therefore undesired.

In order to prevent local cooling down of the lens element 1 by the evaporating immersion fluid 22, or to minimize the local temperature gradients thereby occurring, a thermally conductive component 6 (cf. FIG. 2d), the production process of which is described below on the basis of FIGS. 2a-d, is applied to the lens element 1.

Figure 2A:
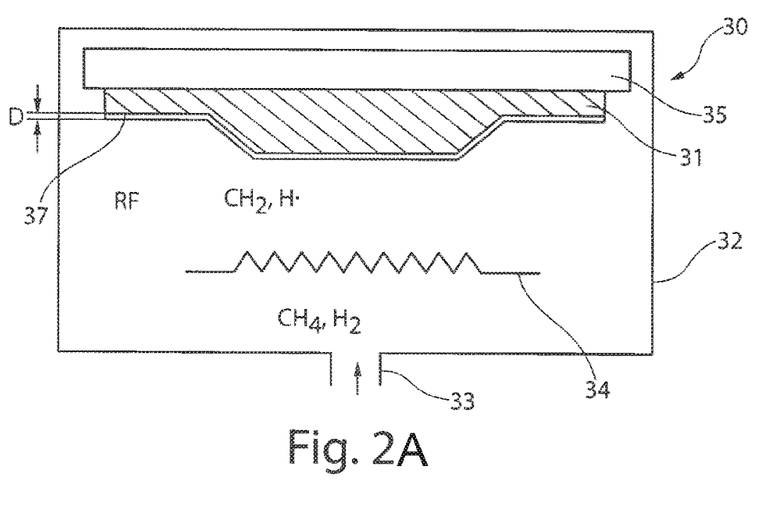
FIGS. 2a-d show schematic representations of a number of process steps in the production of a thermally conductive component made of diamond.

FIG. 2a shows highly schematically a CVD coating apparatus 30, for applying a coating to a carrier body 31, which exactly replicates the relevant contours of the lens element 1, in the present example the contour of the conical lens part 3 with the plane end face 4 and also the radially outward plane lens face 2. The carrier body 31 is located in a coating chamber 32 of the CVD coating apparatus 30, to which precursor gases, in the example shown methane ($CH_4$) and hydrogen ($H_2$), are fed in by way of an inlet opening 33. The precursor gases are passed over an incandescent wire 34 and dissociate, the activation or dissociation additionally being intensified by an alternating field RF, which produces a plasma in the coating chamber 32. With suitably chosen operating parameters of the coating apparatus 30, carbon in the form of a diamond layer 37 is deposited on the carrier body 31.

For producing a polycrystalline or monocrystalline diamond layer 37 on the carrier body 31, it is desirable that the latter is heated up with the aid of a heating element 35 to a temperature of generally more than about 600° C. to 800° C. Materials from which the carrier body 31 is produced should have an (average) coefficient of thermal expansion that is similar at room temperature (22° C.) and at the temperature at which the coating is applied (here: about 800° C.). If this is the case, the deposited diamond layer 37 has few stresses and there are smaller geometrical changes when the carrier body 31 is removed (see below).

In the present case, i.e. with coating temperatures of about 800° C. or above, Si or $SiO_2$ are suitable in particular as materials for the carrier body 31. Si offers the advantage over $SiO_2$ of a high thermal conductivity, which leads to a uniform temperature distribution during the coating, and consequently to uniform layer properties. Many metals can in principle also be coated well, and consequently are suitable in principle as carrier bodies, but generally have much greater differences in the coefficient of thermal expansion in relation to diamond. In order to perfect further the geometry of the deposited diamond layer 37, a change in form as a result of stresses in the production of the diamond layer 37 may also be calculated and/or measured and provisioned for in the geometry or the form of the surface of the carrier body 31.

Figure 2B:
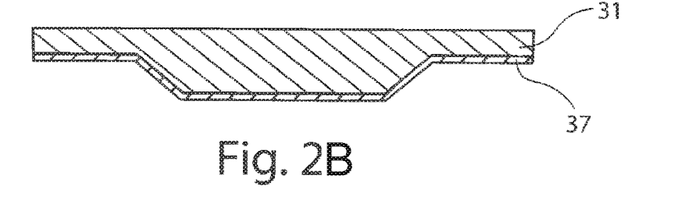

The depositing of the diamond layer 37 is carried out until it has a desired thickness D, which is typically more than 25 μm, advantageously more than 100 μm and generally no more than 500 μm. After the completion of the coating, the carrier body 31 is removed from the coating chamber 32 of the coating apparatus 30, as represented in FIG. 2b. On the carrier body 31 there is the diamond layer 37, the thickness of which is sufficient to form a self-supporting component.

Figure 2C:
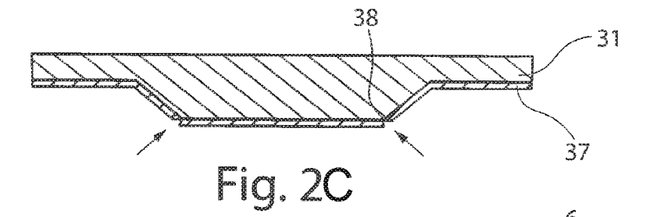

As can be seen in FIG. 2c, the diamond layer 37 is scored into along a predetermined cutting contour 38, which in the example shown is circular, via a laser or by machining. In an optional step which then follows, the diamond layer 37 may also be polished and/or microstructured.

Figure 2D:
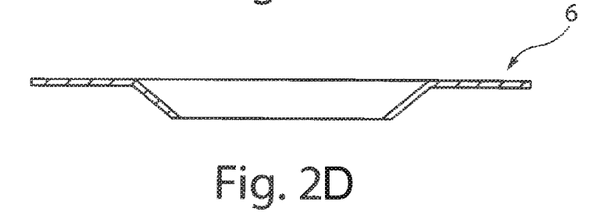

In a step which then follows, the diamond layer 37 is detached from the carrier body 31, for example in that the material of the carrier body 31, for example Si or $SiO_2$, is dissolved in hydrofluoric acid (HF), whereby a self-supporting component 6 made of diamond or a diamond body with a high thermal conductivity is formed, which is represented in FIG. 2d. The thermal conductivity of the diamond component 6 shown in FIG. 2d is at least 500 W K$^{-1}$, it being possible with suitable choice of the coating parameters in the CVD process described above to achieve a thermal conductivity of more than 1000 W m$^{-1}$ K$^{-1}$, preferably of more than 1700 W m$^{-1}$ K$^{-1}$, ideally of more than 2000 W m$^{-1}$ K$^{-1}$. Before the self-supporting component 6 made of diamond is applied to the lens element 1, it may also be surface-modified.

Figure 3A:
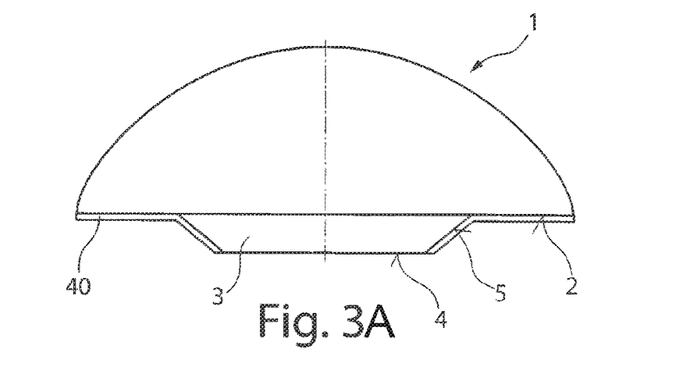
FIGS. 3a-c show schematic representations of process steps for establishing a connection between the thermally conductive component and the lens element from FIG. 1, FIGS. 4a-c show schematic representations of a number of process steps in the production of a thermally conductive component made of a metal.
Figure 3B:
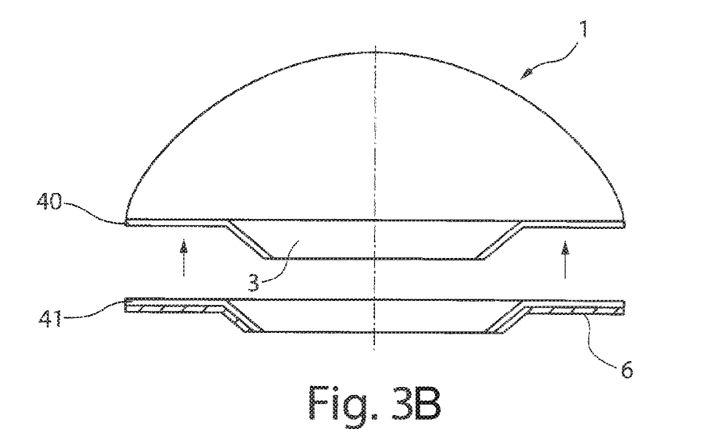

The establishing of a connection between the thermally conductive component 6 shown in FIG. 2d and the lens element 1 from FIG. 1 is described below with reference to FIGS. 3a-c on the basis of the example of an adhesive connection. FIG. 3a shows the lens element 1 onto which a protective layer 40 that is UV resistant and absorbs the UV radiation 9 of the light source 11 has been applied in the region of the lateral surface 5 of the conical lens part 3 and also the radially outward plane lens face 2. The protective layer 40 serves the purpose of protecting an adhesive layer 41 shown in FIG. 3b that has been applied to the thermally conductive component 6 from degradation as a result of stray radiation from the interior of the lens element 1. It goes without saying that, in addition, such a protective layer 40 may also be applied to the inner side, i.e. the side facing the lens element 1, of the thermally conductive component 6 in order to shield the adhesive layer 41 from stray radiation from the environment.

Figure 3C:
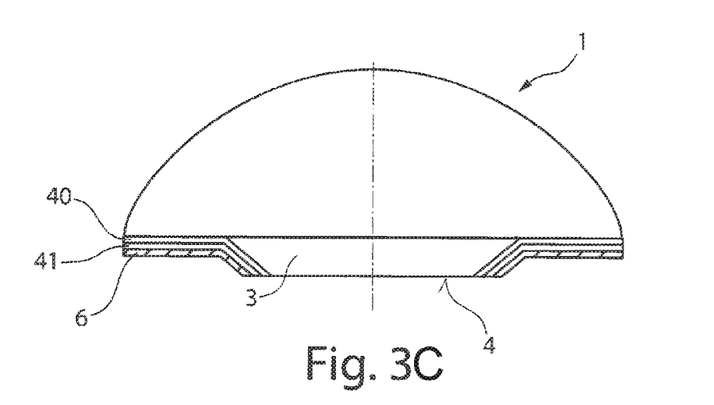

FIG. 3c shows the composite made up of the lens element 1 and the thermally conductive component 6 after the drying of the adhesive layer 41. As described further above, the thermally conductive component 6 is used for avoiding local temperature changes or temperature gradients in the lens element 1 that could otherwise occur as a result of the evaporation of droplets of the immersion fluid 22. The locally produced cold of evaporation or the droplets form on the thermally conductive component 6 and, on account of its high thermal conductivity, are distributed over a large surface, so that high local temperature gradients no longer occur in the lens element 1.

In order to keep the heat transfer from the thermally conductive component 6 to the lens element 1 as small as possible, it is advantageous if the adhesive layer 41, and consequently the connection between the component 6 and the lens element 1, has a heat transfer coefficient of less than 1000 W m$^{-2}$ K$^{-1}$, preferably of less than 100 W m$^{-2}$ K$^{-1}$. It is also advantageous if the thermally conductive component 6 is connected to the lens element 1 by way of an adhesive 41 that has a thermal conductivity of less than 1 W m$^{-1}$ K$^{-1}$, preferably of less than 0.1 W m$^{-1}$ K$^{-1}$. The same also applies to the material of the UV-resistant protective layer 40. As shown in FIGS. 3a-c, the connection may be performed by way of an adhesive layer 41 applied over a surface area or areas, but it is also possible to apply the adhesive only at isolated points, i.e. at a number of adhesive bonding points, along the surface of the thermally conductive component 6 or of the surfaces 2, 5 or 6 to be connected, in order thereby to fix the thermally conductive component 6 to the lens element 1.

As an alternative to establishing a connection by adhesive bonding, the thermally conductive component 6 may also be connected to the lens element 1 in some other way, for example by so-called low-temperature bonding, in which the component 6 and the lens element 1 are heated up to no more than typically about 400° C. in order to produce the connection. An optical connecting or optical contact bonding of the thermally conductive component 6 to the lens element 1 is also possible. When a thermally conductive component 6 of a metal or of a metallic material is used, the connection may also be performed by soldering.

Figure 4A:
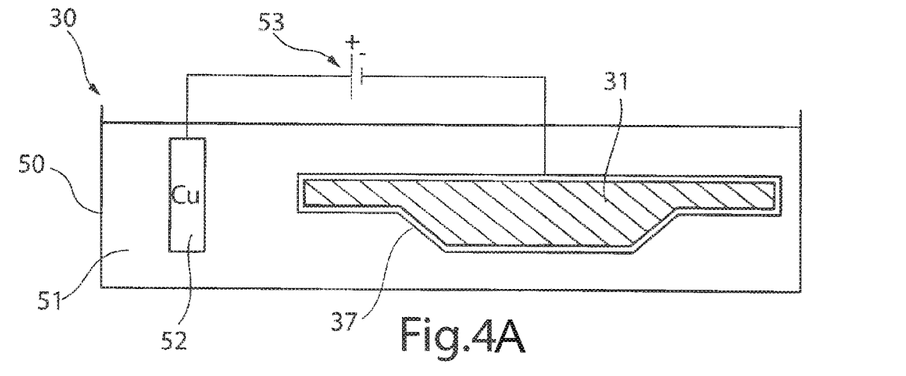
Figure 4B:
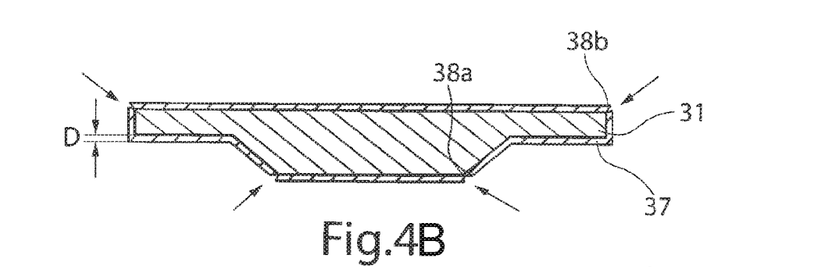
Figure 4C:
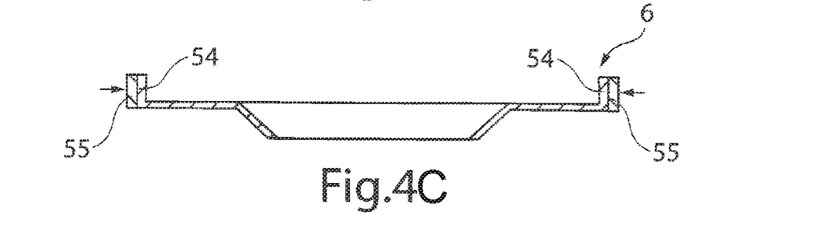

FIGS. 4a-c show a number of process steps for producing a thermally conductive component 6 of metal, in the example shown of copper. By analogy with FIG. 2a, FIG. 4a shows highly schematically a coating apparatus 30 for applying a coating to a carrier body 31, which exactly replicates the relevant contours of the lens element 1, in the present example the contour of the conical lens part 3 with the plane end face 4 and also the radially outward plane lens face 2 (cf. FIG. 3a). In a first step, the carrier body 31 is provided with a suitable passive layer (not shown), which prevents a permanent connection between the material used for the coating, in the present case copper, and the carrier body 31 and makes later separation possible. The carrier body 31 is arranged in an electrolysis vessel 50 with a liquid electrolyte 51, into which a copper anode 52 is immersed. The carrier body 31 is connected in an electrically conductive manner to the anode 52 by way of the liquid electrolyte and by way of a DC source 53 and forms the cathode of the electrochemical coating apparatus 30 shown in FIG. 4a. In the electrolysis or the electrolytic coating, the copper material of the anode 52 is deposited on the carrier body 31 used as a cathode. As an alternative, an anode 52, which consists of an insoluble material, may be used for the deposition and the metallic coating material, for example in the form of copper, is contained in the electrolyte or is added to it. With suitably chosen operating parameters of the coating apparatus 30, a copper layer 37 is deposited on the carrier body 31 and surrounds the carrier body 31 substantially completely.

The depositing of the copper layer 37 is carried out until it has a desired thickness D (cf. FIG. 4b). The desired thickness D depends on the thermal conductivity λ of the coating material used for the electrolytic coating. The depositing of the copper layer 37 is typically carried out until the following applies for the product of the thickness D (in mm) of the copper layer 37 forming the thermally conductive component 6 and the thermal conductivity λ of the copper material: $D\lambda > 1$ W mm m$^{-1}$ K$^{-1}$, preferably $D\lambda > 10$ W mm m$^{-1}$ K$^{-1}$, in particular $D\lambda > 50$ W mm m$^{-1}$ K$^{-1}$. In order to ensure good effectiveness of the thermally conductive component 6, the thickness D of the thermally conductive component 6 (cf. FIG. 4c) is at least 2.5 μm, 25 μm or 100 μm, because copper has a thermal conductivity of $\lambda = 400$ W m$^{-1}$ K$^{-1}$.

After the completion of the coating, the coated carrier body 31 represented in FIG. 4b, also known as a master, is removed from the electrolysis chamber 50 of the coating apparatus 30. On the carrier body 31 there is the copper layer 37, the thickness D of which is sufficient to form a self-supporting thermally conductive component 6, which is represented in FIG. 4c.

As can be seen in FIG. 4b, to produce the thermally conductive component 6 the copper layer 37 is scored into along two predetermined cutting contours 38a, 38b, which in the example shown are circular, via a laser or by machining. As an alternative, the carrier layer 31 may be masked before the metal deposition, so that it is only provided with a copper layer 37 in a desired partial region. The passive layer applied before the coating makes it possible for the copper layer 37 to be detached from the carrier body 31 without being damaged. On account of the different coefficients of thermal expansion of the carrier body 31 and the component 6, the detaching operation can be assisted by rapidly supplying heat/cold. If desired, the carrier body 31 may be used for further electrolytic coating processes.

The thermally conductive component 6 detached from the carrier body 31 has on its radially outward edge a peripheral collar 54, which makes it easier to fasten the thermally conductive component 6 to the optical element 1 from FIG. 1 via a clamping connection. At the peripheral collar 54, the thermally conductive component 6 may be pressed by a peripheral mounting ring 55 in the radial direction against the lens element 1 (not shown in FIG. 4c), as indicated by arrows in FIG. 4c. The thermally conductive component 6 may possibly be slightly deformed (bent) thereby in the region of the peripheral collar 54, so that the latter adapts itself to the convex geometry of the lens element 1. A circular geometry of the collar 54 is advantageous because the thermally conductive component 6 is in this case free of undercuts, and can consequently be detached from the carrier body 31 in an easy way.

The mounting ring 54 forms a clamping connection, which fixes the thermally conductive component 6 in its position in relation to the lens element 1. The thermally conductive component 6 here abuts the lens element 1, i.e. it is not arranged at a distance from the lens element 1. Instead of the clamping connection 54, the thermally conductive component 6 may also be fixed in its position in relation to the lens element 1 via a screwing connection. Typically formed in this case in the thermally conductive component 6 are through-holes for screws, which can be fixed on a mount (not shown in FIG. 4c) of the lens element 1 or on a component, for example a mounting, of the projection lens 13. As an alternative, the thermally conductive component 6 may also be connected to the lens element 1 by a cohesive connection, for example by adhesive bonding or by soldering. It goes without saying that some other material, in particular a metal material, can be used instead of copper for producing the thermally conductive component 6.

Figure 5:
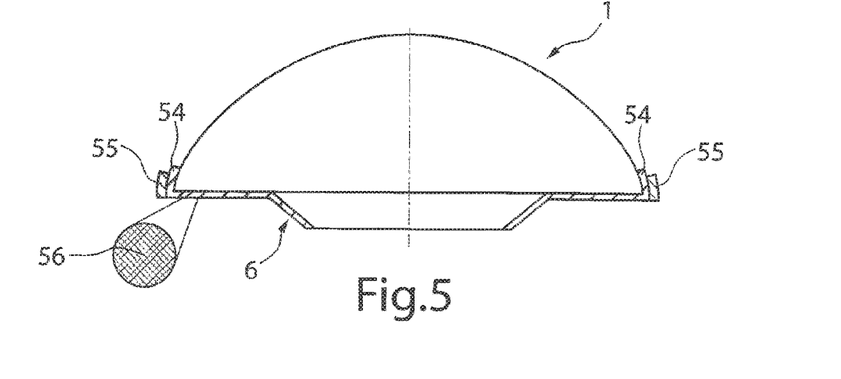
FIG. 5 shows a schematic representation of a thermally conductive component in the form of a woven fabric that has been slipped onto a lens element.

FIG. 5 shows the lens element 1 from FIG. 1 having a thermally conductive component 6 the material of which forms a preformed metallic woven fabric 56. The preforming or production of the woven fabric 56 may be performed for example in a manner such as that used for the sheathing of cables. The preformed woven fabric 56 has a bend or a kink in the region of the transition between the plane lens face 2 and the lateral surface 5 of the conical lens part 3. The preformed thermally conductive component 6 consequently has a geometry that is adapted to the geometry of the lens element 1. In particular, the region of the woven fabric 56 that covers the conical lens part 3 or the lateral surface 5 may if desired be produced here with slightly smaller dimensions than the dimensions of the lateral surface 5 of the conical lens part 3 itself. In this way, this region of the woven fabric 56 can exert a mechanical stress on the conical lens part 3 during the attachment of the thermally conductive component 6. The mechanical stress can if desired prevent sliding of the thermally conductive component 6 on the lens element 1.

In the example shown in FIG. 5, the thermally conductive component 6 has a peripheral collar 54, which can be slipped onto the edge of the lens element 1 in order to fix the woven fabric 56 on the lens element 1. The radial force that the woven fabric 56 exerts on the edge of the lens element 1 is generally not great enough to fix the latter securely on the lens element 1. The woven fabric 56 may therefore be additionally fixed on the lens element 1, for example via a clamping connection 55 in the form of a peripheral mounting ring.

When a thermally conductive component 6 in the form of a woven fabric 56 is used, it may be that the penetration of the immersion fluid 22 into an intermediate space between the thermally conductive component 6 and the lens element 1 cannot be prevented completely. The thermally conductive component 6 allows any inhomogeneities in the temperature that may be caused by cold of evaporation to be distributed over the entire plane lens face 2 and also the lateral surface 5 of the conical lens part 3. Consequently, imaging errors of the lens element 1 can be reduced even when a not completely liquid-impermeable woven fabric 56 is used as the thermally conductive component 6. The thickness D of the thermally conductive component 6 is chosen such that the product of the thickness D and the thermal conductivity λ of the thermally conductive woven fabric 56 is more than 1 W mm m$^{-1}$ K$^{-1}$, preferably more than 10 W mm m$^{-1}$ K$^{-1}$, in particular more than 50 W mm m$^{-1}$ K$^{-1}$. As an alternative or in addition to metallic materials, for example Al, Ag, Cu, Cr, . . . , carbon compounds may also be used for producing the woven fabric 56.

Figure 6:
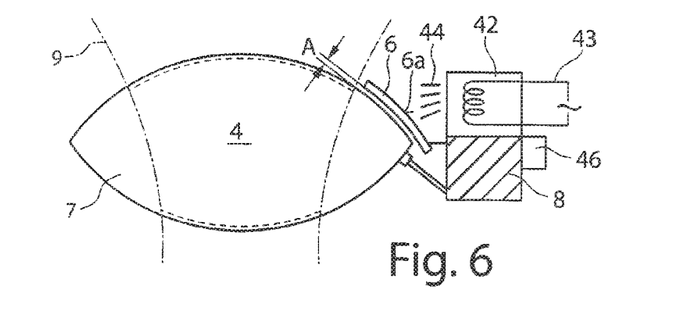
FIG. 6 shows a schematic representation of a thermally conductive component for protecting another optical element of a projection lens from the waste heat of a manipulator.

FIG. 6 shows a further possibility for using the thermally conductive component 6, to be precise as a shielding for another lens element 7 of the projection lens 13 (cf. also FIG. 1). In the example shown, the thermally conductive component 6 is arranged between a heat source in the form of an actuator 42 and the further lens element 7. In the example shown, the thermally conductive component 6 is produced from diamond and is arranged outside the optically used volume region 4 of the further lens element 7 within which the radiation 9 of the light source 11 passes in a directed manner through the further lens element 7 (indicated by dashed lines in FIG. 6). The thermally conductive component 6 is adapted to the geometry or to the curvature of the further lens element 7 and is arranged at a distance A from the further lens element 7 that is about 500 μm. Typical values for the distance A between the further lens element 7 and the thermally conductive component 6 are between about 100 μm and about 1000 μm.

The actuator 42 is used for actuating or moving a mounting element 8 for the further lens element 7. For this purpose, the actuator 42 is passed through at times by current that is delivered by a voltage source 43. The actuator 42 is heated by the current flow and thereby changes its form in order to act on the mounting element 8 and displace the other lens element 7. The heating causes the actuator 42 to give off thermal radiation 44 (IR radiation) to the environment, in the example shown the proportion of the thermal radiation 44 that is incident on the lens element 1 being absorbed by the thermally conductive component 6.

In the example shown, the material of the thermally conductive component 6 is diamond, which represents a material that is transparent to the thermal radiation 44. To make the thermally conductive component 6 opaque to the thermal radiation, in the example shown in FIG. 6 a coating 6a that absorbs the thermal radiation 44 has been applied to the thermally conductive component 6 on the side that is facing the actuator 42.

The thermal radiation 44 that is taken up or absorbed by the thermally conductive component 6 is transmitted from it to the mounting 8 to which the thermally conductive component 6 is fastened. The mounting element 8 itself, or in the case shown a cooler 46 that is connected to the latter and is flowed through by a cooling medium, for example water, is used for dissipating the heat transmitted to the mounting element 8. It goes without saying that it is only by way of example that the mounting element 8, the thermally conductive component 6 and the actuator 42 are shown in FIG. 6 only on one side of the further lens element 7, and that conversely one or more thermally conductive components 6 may if desired be arranged in a distributed manner along the circumference of the further lens element 7, as long as a plurality of actuators are provided for the movement of the lens element 7. Unlike the situation shown in FIG. 6, the thermally conductive component 6 may if desired also extend annularly around the beam path of the used radiation 9.

Figure 7:
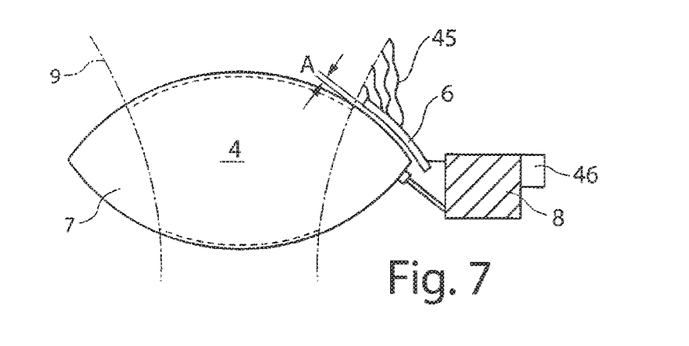
FIG. 7 shows a representation analogous to FIG. 5 in which the thermally conductive element is used for protecting the other optical element from stray light.

FIG. 7 shows a representation analogous to FIG. 6 in which the thermally conductive component 6 is likewise used as shielding for the further lens element 7. However, the thermally conductive component 6 is in this case used for shielding stray radiation 45 that originates from the beam path of the radiation 9 of the light source 11. The wavelength of the stray radiation 45 generally corresponds to the used wavelength 4, or deviates only slightly from the used wavelength $\lambda_B$. The diamond material of the thermally conductive component 6 is opaque to UV wavelengths (<220 nm), and therefore absorbs the stray radiation 45 without an additional coating. As described in connection with FIG. 6, the heat produced during the absorption of the stray radiation 45 is transported by the thermally conductive component 6 by way of the mounting element 8 to the cooler 46 and is removed by the latter or a cooling medium flowing in it.

Figure 8:
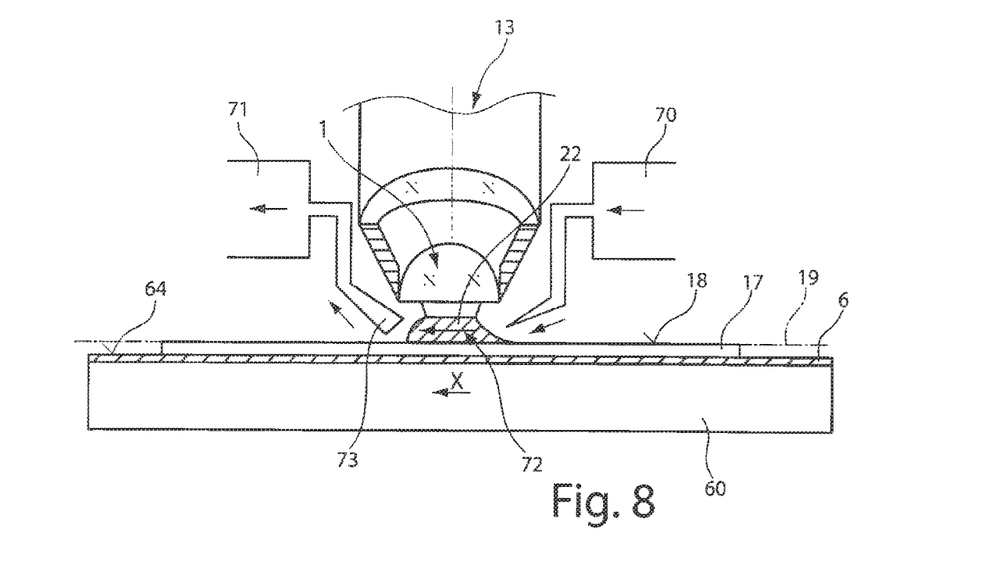
FIG. 8 shows a schematic representation of a detail of the optical assembly from FIG. 1 with a wafer table to which a thermally conductive component has been applied.

Another application for a thermally conductive component 6 that has been produced in the way described in connection with FIGS. 2a-d is represented in FIG. 8, which shows in the form of a detail the projection lens 13 and also the wafer 17, used as a light-sensitive substrate, that is mounted on a wafer table 60 for positioning. The assembly shown in FIG. 6 differs from the assembly shown in FIG. 1 substantially in that the expansion of the immersion fluid 22 is restricted to a region 72 between the wafer 17 and the last optical element 1 of the projection lens 13. The wafer 17 is arranged here such that its plane substrate surface 18 substantially coincides with the image plane 19 of the projection lens 13. The wafer table 60, and with it the wafer 17, can be moved in the X direction via a displacing device that is not represented in FIG. 6, so that different regions on the wafer 17 can be moved to during the exposure.

Via a feeding device 70 and a suction extracting device 71, the immersion fluid 22 is on the one hand fed to the region 72 between the last optical element 1 and the wafer 17 and on the other hand is extracted from it, so that even during the movement of the wafer table 60 the immersion fluid 22 remains restricted to the region 72 between the feeding device 70 and the suction extracting device 71. The suction extracting device 71 generally works with a negative pressure with respect to the environment, so that the immersion fluid 22 can be easily taken up by way of an inlet 73. This allows a continuous (and dynamic) exchange of the immersion fluid 22 to take place, while it remains restricted to the partial region of the substrate surface 18 that is currently being used for the exposure.

The local wetting in the region 72 offers the advantage that only small amounts of immersion fluid 22 have to be accelerated during the displacement of the wafer table 60. There are thus no undesired turbulences in the immersion fluid 22, and wave formation on account of the inertia of the immersion fluid 22 can be avoided.

Mounted on the wafer table 60, to be more precise to its upper side 64, in the present example is a thermally conductive component 6 made of diamond, which is in the form of a plate. The fastening of the thermally conductive component 6 to the wafer table 60, which may be formed for example entirely or partially from cordierite or from Zerodur®, may be performed for example in the way described further above in conjunction with FIGS. 3a-c. With the aid of the thermally conductive component 6 it is possible to prevent parts of the immersion fluid or droplets that are not taken up by the suction extracting device 71 that reach a region of the upper side 64 of the wafer table 60 that is not covered by the wafer 17 and wet this region in an undesired way when there is a jerky movement of the wafer table 60 and/or the wafer 17 is exchanged for another wafer (for example in the X direction), from leading to a local lowering of the temperature of the material of the wafer table 60. In order to produce a temperature distribution that is as uniform as possible in the thermally conductive component 6, the latter may if desired be in connection with a heat source (not shown) or a temperature stabilizer in order to keep the thermally conductive component 6 at a constant temperature that coincides with the temperature of the heat source.

As an alternative to the use of CVD diamond as a material for the thermally conductive component 6, other materials may also be used, as long as they have the desired high thermal conductivity of more than 500 W m$^{-1}$ K$^{-1}$ at room temperature, for example carbon nanotubes. It is also possible to use other thermally conductive components 6 in the case of which the product of the thickness D of the thermally conductive component 6 and the thermal conductivity λ of the thermally conductive material has a value greater than 1 W mm m$^{-1}$ K$^{-1}$, preferably greater than 10 W mm m$^{-1}$ K$^{-1}$, in particular greater than 50 W mm m$^{-1}$ K$^{-1}$. If an optical assembly is operated at an operating temperature other than room temperature, for example at very low temperatures of less than about −195° C., there is a broader selection of materials that have the desired high thermal conductivity. At these temperatures, for example, sapphire may also be used as a material for the thermally conductive component.

Other application areas in which a thermally conductive component that is appropriately adapted in its geometry can be meaningfully used are for example mirrors for EUV lithography, the substrate materials of which, such as for example ULE® or Zerodur®, may likewise be protected via the thermally conductive component 6 from undesired local changes in temperature or from excessive local temperature gradients.

What is claimed is:

1. An optical assembly, comprising:
    a device configured to position a light-sensitive substrate; and
    a thermally conductive component mounted on the device,
    wherein at least one of the following holds:
        the thermally conductive component comprises a material with a thermal conductivity of more than 500 W m$^{-1}$ K$^{-1}$; and
        a product of a thickness of the thermally conductive component in millimeters and the thermal conductivity of the material is greater than 1 W mm m$^{-1}$ K$^{-1}$, and
    wherein at least one of the following holds:
        the thickness of the thermally conductive component is less than 500 μm;
        a product of a thickness of the thermally conductive component in millimeters and the thermal conductivity of the material is greater than 1 W mm m$^{-1}$ K$^{-1}$, and the material comprises a metal;
        the material comprises a woven fabric;
        the thermally conductive component is connected to the device over at least one surface area at at least one isolated point;
        the thermally conductive component is connected to the device at a connection having a heat transfer coefficient of less than 1000 W m$^{-2}$ K$^{-1}$; and
        the thermally conductive component is connected to the device via a material having a thermal conductivity of less than 1 W m$^{-1}$ K$^{-1}$.

2. The optical assembly of claim 1, wherein the material has a thermal conductivity of more than 500 W m$^{-1}$ K$^{-1}$.

3. The optical assembly of claim 1, wherein the product of a thickness of the thermally conductive component in millimeters and the thermal conductivity of the material is greater than 1 W mm m$^{-1}$ K$^{-1}$.

4. The optical assembly of claim 1, wherein the material comprises polycrystalline diamond and/or monocrystalline diamond.

5. The optical assembly of claim 1, wherein the material comprises carbon nanotubes.

6. The optical assembly of claim 1, wherein the material comprises a CVD material.

7. The optical assembly of claim 1, wherein the thickness of the thermally conductive component is less than 500 μm.

8. The optical assembly of claim 1, wherein a product of a thickness of the thermally conductive component in millimeters and the thermal conductivity of the material is greater than 1 W mm m$^{-1}$ K$^{-1}$, and the material comprises a metal.

9. The optical assembly of claim 1, wherein the material comprises a woven fabric.

10. The optical assembly of claim 1, wherein the material comprises a woven fabric, and the woven fabric comprises a metallic material and/or a carbon compound.

11. The optical assembly of claim 1, wherein the thermally conductive component is connected to the device.

12. The optical assembly of claim 1, wherein the thermally conductive component is connected to the device over at least one surface area at at least one isolated point.

13. The optical assembly of claim 1, wherein the thermally conductive component is connected to the device at a connection having a heat transfer coefficient of less than 1000 W m$^{-2}$ K$^{-1}$.

14. The optical assembly of claim 1, wherein the thermally conductive component is connected to the device via a material having a thermal conductivity of less than 1 W m$^{-1}$ K$^{-1}$.

15. The optical assembly of claim 1, wherein the thermally conductive component is arranged at a distance from the device.

16. The optical assembly of claim 1, further comprising a heat source, wherein at least one side of the thermally conductive component is connected to the heat source.

17. The optical assembly of claim 1, wherein the optical assembly is configured so that, during use of the optical assembly, at least part of the thermally conductive component is exposed to radiation which the thermally conductive component is configured to absorb.

18. The optical assembly of claim 1, wherein the optical assembly is configured so that, during use of the optical assembly, at least part of the thermally conductive component is exposed to an evaporating liquid.

19. The optical assembly of claim 1, wherein
    the thermal conductivity of the material is more than 500 W m$^{-1}$ K$^{-1}$; and
    the product of a thickness of the thermally conductive component in millimeters and the thermal conductivity of the material is greater than 1 W mm m$^{-1}$ K$^{-1}$.

20. The optical assembly of claim 1, wherein at least one of the following holds:
    the material comprises carbon nanotubes;
    the material comprises a woven fabric;
    the thermally conductive component is connected to the device at a connection having a heat transfer coefficient of less than 1000 W m$^{-2}$ K$^{-1}$; and
    the thermally conductive component is connected to the device via a material having a thermal conductivity of less than 1 W m$^{-1}$ K$^{-1}$.

* * * * *

UNITED STATES PATENT AND TRADEMARK OFFICE
CERTIFICATE OF CORRECTION

PATENT NO. : 11,194,119 B2
APPLICATION NO. : 16/701480
DATED : December 7, 2021
INVENTOR(S) : Julian Kaller et al.

It is certified that error appears in the above-identified patent and that said Letters Patent is hereby corrected as shown below:

On the Title Page

Column 2 (Item (56) Other Publications), Line 1, delete "Thermatest" and insert -- Thermtest --;

Column 2 (Item (56) Other Publications), Line 2, delete "thermatest" and insert -- thermtest --;

In the Specification

Column 9, Line 51, delete "SF6." and insert -- $SF_6$. --;

Column 11, Line 35, after "wavelength" insert -- $\lambda_B$ --;

Column 13, Line 42, delete "W K$^{-1}$," and insert -- W m$^{-1}$ K$^{-1}$, --;

Column 17, Line 55, delete "4," and insert -- $\lambda_B$, --.

Signed and Sealed this
First Day of March, 2022

Drew Hirshfeld
*Performing the Functions and Duties of the*
*Under Secretary of Commerce for Intellectual Property and*
*Director of the United States Patent and Trademark Office*